(12) United States Patent
Lueck et al.

(10) Patent No.: US 12,411,166 B2
(45) Date of Patent: Sep. 9, 2025

(54) MEASUREMENT DEVICE FOR CHARACTERIZING A DEVICE-UNDER-TEST

(71) Applicant: Rohde & Schwarz GmbH & Co. KG, Munich (DE)

(72) Inventors: Thorsten Lueck, Neuried (DE); Jan-Patrick Schultheis, Kirchheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 184 days.

(21) Appl. No.: 18/353,231

(22) Filed: Jul. 17, 2023

(65) Prior Publication Data
US 2025/0027986 A1   Jan. 23, 2025

(51) Int. Cl.
*G01R 31/28* (2006.01)
*G01R 27/28* (2006.01)
*G01R 31/319* (2006.01)

(52) U.S. Cl.
CPC ......... *G01R 31/2822* (2013.01); *G01R 27/28* (2013.01); *G01R 31/31917* (2013.01)

(58) Field of Classification Search
CPC ......... G01R 27/28; G01R 27/32; G01R 35/00
See application file for complete search history.

(56) References Cited

U.S. PATENT DOCUMENTS

| | | | | |
|---|---|---|---|---|
| 6,943,563 B2 * | 9/2005 | Martens | ................. | H04B 17/20 |
| | | | | 324/638 |
| 11,619,662 B1 | 4/2023 | Bonaguide | | |
| 2004/0193382 A1 * | 9/2004 | Adamian | ............... | B82Y 30/00 |
| | | | | 702/118 |
| 2004/0251922 A1 * | 12/2004 | Martens | ............... | G01R 35/005 |
| | | | | 324/601 |
| 2006/0229020 A1 * | 10/2006 | Mlinarsky | ............ | H04B 17/391 |
| | | | | 455/67.14 |
| 2011/0169502 A1 * | 7/2011 | Reichel | ................ | G01R 35/005 |
| | | | | 324/601 |
| 2017/0153280 A1 * | 6/2017 | Mikulka | ................ | G01R 35/00 |

* cited by examiner

Primary Examiner — Huy Q Phan
Assistant Examiner — Temilade S Rhodes-Vivour
(74) Attorney, Agent, or Firm — Studebaker Brackett PLLC

(57) ABSTRACT

The present disclosure relates to a measurement device for characterizing a device-under-test, DUT. The device includes an RF signal generator to generate test signals in parallel. The test signals each have a different frequency. A signal path connects the RF signal generator to a port of the measurement device. The port is connected to the DUT. The signal path feeds test signals to the port and receives response signals of the DUT from the port. The device includes a measurement unit; a forward coupler connected to the signal path and forwards at least a part of each of the test signals to the measurement unit; and a reverse coupler is connected to the signal path and forwards at least a part of the response signals to the measurement unit. The measurement unit simultaneously measures the forwarded parts of the test and response signals, each in amplitude and phase.

16 Claims, 6 Drawing Sheets

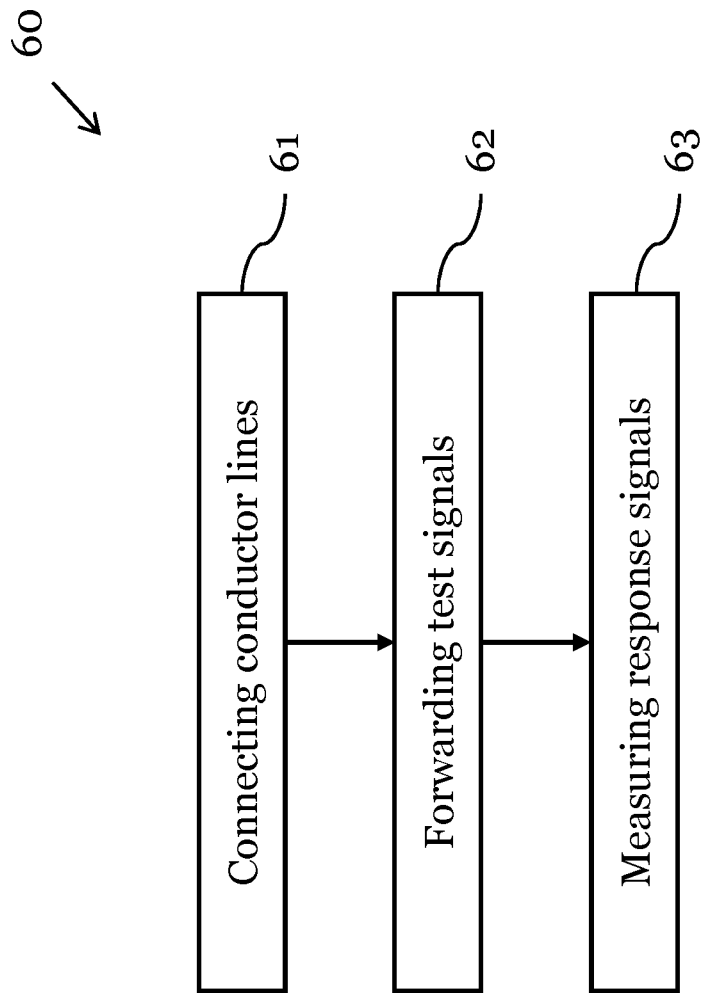

MEASUREMENT DEVICE FOR CHARACTERIZING A DEVICE-UNDER-TEST

TECHNICAL FIELD

In general, the disclosure relates to the characterization and testing of RF systems and components. More specifically, the present disclosure relates to a measurement device, such as a vector network analyzer, for characterizing a device-under-test (DUT).

BACKGROUND ART

RF (radio frequency) equipment, such as signal amplifiers or passive components (e.g., cables), can be characterized and/or tested by supplying them with signals of different frequencies and analyzing how these signals are modified or distorted by the equipment. This often involves a large number of successive measurements with different signals, which can lead to long measurement times.

For example, when characterizing Ethernet cables according to the IEEE803 standard, so-called 4-port measurements are repeatedly performed on the passive lines of the cables. In order to characterize all influences caused by crosstalk, several hundred 4-port measurements are necessary, which add up to several dozen minutes or even hours.

SUMMARY

Thus, there is a need to provide an improved measurement device for characterizing a DUT, which avoids the above-mentioned disadvantages. In particular, the measurement times to characterize the DUT should be reduced.

This is achieved by the embodiments provided in the enclosed independent claims. Advantageous implementations of the present disclosure are further defined in the dependent claims.

According to a first aspect, the present disclosure relates to a measurement device for characterizing a device-under-test, DUT. The measurement device comprises: an RF signal generator configured to generate at least two test signals in parallel, wherein the at least two test signals each have a different frequency; a signal path connecting the RF signal generator to a port of the measurement device, wherein the port is arranged for being connected to the DUT; the signal path being configured to feed the at least two test signals to the port and to receive at least two response signals of the DUT from the port; a measurement unit; a forward coupler being connected to the signal path and adapted to forward at least a part of each of the at least two test signals to the measurement unit; and a reverse coupler being connected to the signal path and adapted to forward at least a part of each of the at least two response signals to the measurement unit. The measurement unit is adapted to simultaneously measure the forwarded parts of the at least two test signals and the at least two response signals, each in amplitude and phase.

This achieves the advantage that measurement times needed to characterize the DUT are reduced. This is, in particular, due to the parallelization of the measurements with multiple signals at different frequencies. For instance, when measuring with two test respectively response signals in parallel, the measurement time can be reduced by a factor of two compared to measuring with only one test signal at a time.

The at least two test signals can be RF signals. In particular, the test signals are tones, i.e. signals with a defined frequency and a narrow bandwidth. Likewise, the response signals can also be RF signals and/or tones.

The test signals can be CW signals with different frequencies. For instance, the at least two test signals can comprise at least a first test signal at a first frequency and at least a second test signal at a second frequency different to the first frequency.

The response signals can be generated by the DUT in response to receiving the test signals. For instance, the at least two response signals can comprise at least a first response signal and at least a second response signal. The first response signal can be generated by the DUT in response to the first test signal and the second response signal can be generated by the DUT in response to the second test signal. The response signals can be CW signals and/or can have different frequencies.

In particular, the test signals are travelling from the RF signal generator to the port, while the response signals are travelling from the port to the RF signal generator. As such, the response signals can be reflections of the test signals (i.e., reflected signals based on the test signals) form the DUT.

The measurement device can be a vector network analyzer (VNA).

The DUT can be an active or a passive RF device. For instance, the DUT can be an amplifier or a cable, e.g. an Ethernet cable. The DUT can be connected to the port via a suitable connections means, e.g., an adapter and/or a connecting cable.

The port can be an RF port and can comprise a coaxial RF connector.

The RF signal generator can comprise one or more RF signal sources. For example, the RF signal generator comprises one RF signal source for each test signal which is generated in parallel. Alternatively, the RF signal generator can also comprise a single signal generator capable of generating multiple RF test signals, e.g. a comb generator.

The forward coupler and the reverse coupler can each be directional couplers.

The measurement unit can comprise a processing unit, such as a microprocessor or an ASIC. The measurement unit can comprise at least one integrated circuit.

Here, simultaneously measuring forwarded parts of the test and the response signals may refer to measuring the forwarded parts of these signals in parallel.

In an embodiment, the RF signal generator is configured to amend the frequencies of the at least two test signals by predefined and/or adjustable frequency steps over a determined frequency bandwidth.

This achieves the advantage that the measurement device can sweep through a specific frequency range. The RF signal generator can amend the frequencies of the test signals stepwise or continuously. In this way, multiple parallel measurements can be carried out consecutively.

In an embodiment, the at least two test signals are each increased by the same frequency, starting from their respective initial frequencies.

In an embodiment, the measurement device further comprises: a first mixing unit which is configured to down-convert the forwarded parts of the at least two test signals into intermediate frequency, IF, signals; and a first analog-to-digital converter, ADC, unit which is configured to digitize the down-converted parts of the test signals; and the measurement unit further comprises: a second mixing unit which is configured to down-convert the forwarded parts of the at least two response signals into IF signals; and a second ADC unit which is configured to digitize the down-converted parts of the response signals.

This achieves the advantage that the test signals and the response signals can be fed to the measurement unit in a digitalized form.

Here, the "down-converted parts" of the test signal(s) respectively response signal(s) refer to the parts of said signals which were forwarded by the respectively couplers and then down-converted by the mixing units. These "down-converted parts" can then be digitalized by the ADC units.

In an embodiment, the first mixing unit comprises only one mixer which is configured to down-convert the forwarded parts of the at least two test signals; and the first ADC unit comprises only one ADC which is configured to digitize the down-converted parts of the test signals.

In an embodiment, the second mixing unit comprises only one mixer which is configured to down-convert the forwarded parts of the at least two response signals; and the second ADC unit comprises only one ADC which is configured to digitize the down-converted parts of the response signals.

For example, the one ADC of the first ADC unit can be a broadband ADC which is suitable to digitalize the at least two test signals in parallel. Likewise, the one ADC of the second ADC unit can also be a broadband ADC which is suitable to digitalize the at least two response signals in parallel.

In an embodiment, the first mixing unit comprises at least two mixers, wherein a first mixer of the at least two mixers is configured to down-convert the forwarded part of a first one of the at least two test signals and wherein a second mixer of the at least two mixers is configured to down-convert the forwarded part of a second one of the at least two test signals; and wherein the first ADC unit comprises at least two ADCs, wherein a first ADC of the at least two ADCs is configured to digitize the down-converted part of the first one of the test signals and wherein a second ADC of the at least two ADCs is configured to digitize the down-converted part of the second one of the test signals.

In an embodiment, the second mixing unit comprises at least two mixers, wherein a first mixer of the at least two mixers is configured to down-convert the forwarded part of a first one of the at least two response signals and wherein a second mixer of the at least two mixers is configured to down-convert the forwarded part of a second one of the at least two response signals; and wherein the second ADC unit comprises at least two ADCs, wherein a first ADC of the at least two ADCs is configured to digitize the down-converted part of the first one of the response signals and wherein a second ADC of the at least two ADCs is configured to digitize the down-converted part of the second one of the response signals.

For example, if the ADC units comprise multiple ADCs, each ADC can be a narrowband ADC suitable for digitalizing one of the test respectively response signals.

In an embodiment, the measurement device further comprises a further signal path connecting the RF signal generator to a further port of the measurement device, wherein the further port is arranged for being connected to the DUT; and wherein the further signal path is configured to feed the at least two test signals to the further port and/or to receive at least two further response signals of the DUT from the further port.

The at least two further response signals can be signals generated by the DUT in response to the at least to two test signals forwarded to the DUT via the port or via the further port. The at least two further response signals can comprise at least a third and a fourth response signal.

The at least two test signals forwarded by the further signal path can be identical to the at least two test signals forwarded by the signal path (in particular, identical in frequency and amplitude). For example, the measurement device can first forward the at least two test signals to the DUT via the signal path and the port and, subsequently, via the further signal path and the further port.

In an embodiment, the measurement device comprises: a further forward coupler being connected to the further signal path and adapted to forward at least a part of each of the at least two test signals to the measurement unit; and/or a further reverse coupler being connected to the further signal path and adapted to forward at least a part of each the at least two further response signals to the measurement unit.

For example, the measurement unit is adapted to simultaneously measure the forwarded parts of the at least two test signals and/or the at least two further response signals, each in amplitude and phase.

In an embodiment, in a first operating state, the measurement device is configured to transmit the at least two test signals through the first signal path to the first port; and to: a) forward parts of each of the at least two test signals via the forward coupler to the measurement unit; b) forward parts of each of the at least two response signals from the first port via the reverse coupler to the measurement unit; and c) forward parts of each of the at least two further response signals from the further port via the further reverse coupler to the measurement unit.

In an embodiment, in a second operating state, the measurement device is configured to transmit the at least two test signals through the further signal path to the further port; and to: a) forward parts of each of the at least two test signals via the further forward coupler to the measurement unit; b) forward parts of each of the at least two response signals from the port via the reverse coupler to the measurement unit; and c) forward parts of each of the at least two further response signals from the further port via the further reverse coupler to the measurement unit.

In both the first and second operating state, the measurement unit can be adapted to simultaneously measure the forwarded parts of the at least two test signals, the at least two response signals and the at least two further response signals, each in amplitude and phase.

In an embodiment, the measurement unit is configured to calculate S-parameters of the DUT over a determined frequency bandwidth at least based on the measurements of the forwarded parts of the at least two test signals and the at least two response signals.

In an embodiment, the measurement device comprises at least four ports, wherein each of the at least four ports is arranged for being connected to the DUT, wherein each of the at least four ports is connected to the RF signal generator by a respective signal path, wherein the measurement device is adapted to apply the at least two test signals to each of the at least four ports in an alternating manner; and wherein each signal path is connected to the measurement unit by a respective forward coupler and a respective reverse coupler. This achieves the advantage that the measurement device can carry out a 4-port measurement with the DUT.

According to a second aspect, the present disclosure relates to a system comprising: the measurement device of the first aspect of the disclosure; and a switch matrix which is connected between at least one port of the measurement device and the DUT; wherein the measurement device is configured to control the switch matrix.

In an embodiment, the switch matrix comprise a plurality of test ports adapted to be connected to one or more than one DUT; wherein the switch matrix is configured to subsequently connect each of the plurality of the test ports to the at least one port of the measurement device. This achieves the advantage that DUT, such as cables, can be measured in a simple and efficient way.

According to a third aspect, the present disclosure relates to a method of operating the system of the second aspect of the disclosure to analyze a DUT, like a cable, which comprises a plurality of conductor lines. The method comprises the steps of: connecting both ends of the plurality of conductor lines to respective test ports of the switch matrix; forwarding the at least two test signals to one end of one of the plurality of conductor lines; and measuring the at least two response signals at the other end of the conductor line which receives the at least two test signals, and at both ends of one, more or all further conductor lines of the plurality of conductor lines. Of course, the frequency of the at least two test signals can be swept through a pre-defined frequency band. The response signals can be measured at more or all further conductor lines in parallel or sequentially. If the measurement is done sequentially, then the test signals are preferably applied and swept through a pre-defined frequency band for each of the further conductor lines

BRIEF DESCRIPTION OF THE DRAWINGS

The above-described aspects and implementation forms of the present disclosure will be explained in the following description of specific embodiments in relation to the enclosed drawings, in which:

FIG. 6 shows a flow diagram of a method of operating a system comprising a measurement device and a switch matrix according to an embodiment.

DETAILED DESCRIPTIONS OF EMBODIMENTS

Figure 1:
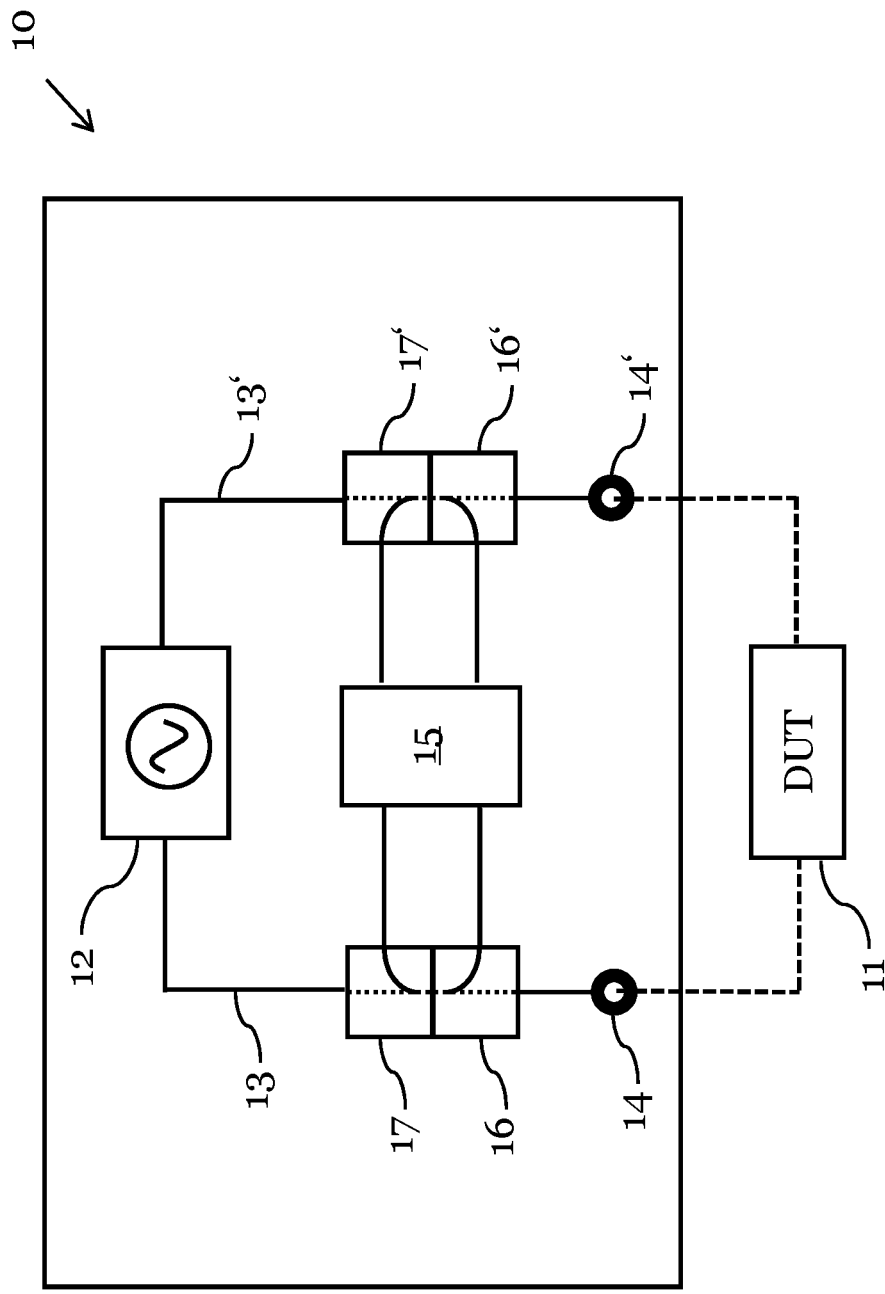
FIG. 1 shows a schematic diagram of a measurement device for characterizing a DUT according to an embodiment.

FIG. 1 shows a schematic diagram of a measurement device 10 for characterizing a DUT 11 according to an embodiment.

The measurement device 10 comprises: an RF signal generator 12 configured to generate at least two test signals in parallel, wherein the at least two test signals each have a different frequency; a signal path 13 connecting the RF signal generator 12 to a port 14 of the measurement device, wherein the port 14 is arranged for being connected to the DUT 11. The signal path 13 is configured to feed the at least two test signals to the port 14 and to receive at least two response signals of the DUT 11 from the port 14. The measurement device 10 further comprises a measurement unit 15; a forward coupler 16 being connected to the signal path 13 and adapted to forward at least a part of each of the at least two test signals to the measurement unit 15; and a reverse coupler 17 being connected to the signal path 13 and adapted to forward at least a part of each of the at least two response signals to the measurement unit 15. The measurement unit 15 is adapted to simultaneously measure the forwarded parts of: the at least two test signals and the at least two response signals, each in amplitude and phase.

The DUT 11 can be an active RF device, such as an amplifier, or a passive device, such as a cable.

Each of the test signals and/or the response signals can be a CW signal (i.e., a sine signal). The at least two test signals can comprise a first test signal and a second test signal, and the at least two response signals can comprise a first response signal and a second response signal. For example, the first response signal can be generated by the DUT based on the first test signal, wherein it has the same frequency as the first test signal but differs from the first test signal in frequency and/or phase. Likewise, the second response signal can be generated by the DUT based on the second test signal, wherein it has the same frequency as the second test signal but differs from the second test signal in frequency and/or phase.

The at least two test signals can be signals that travel from the RF signal generator 12 towards the port 14, and the at least two response signals can be signals that travel from the port 14 towards the RF signal generator 12.

The couplers 16, 17 can be directional couplers, i.e., couplers which only couple power flowing in one direction. The forward coupler 16 can be configured to couple defined amounts of the electromagnetic power of signals, which travel on the signal path 13 from the RF signal generator 12 towards the port 14, to the measurement unit 15. Likewise, the reverse coupler 17 can be configured to couple defined amounts of the electromagnetic power of signals, which travel on the signal path 13 from the port 14 towards the RF signal generator 12, to the measurement unit 15. As such, the couplers 16, 17 can be configured to forward at least a part of the electromagnetic power of the test signals respectively the response signals to the measurement unit 15.

By supplying the DUT with two (or more) test signals in parallel, the measurement device 10 can measure a response of the DUT to the two frequency signals simultaneously for one port. Due to the frequency offset of the test signals, the overall measurement time can be reduced, e.g. cut in half if two test signals are used in parallel. In particular for passive DUTs 11, such as cables or electrical lines, the measurement time can be reduced significantly (e.g., by a factor of two).

The RF signal generator 12 can be configured to stepwise or continuously amend the frequencies of the at least two test signals by certain frequency steps over a determined frequency bandwidth. The frequency steps can be predefined and/or adjustable. In this way, the RF signal generator 12 can perform a frequency sweep over the frequency bandwidth. During each step of the frequency sweep, the RF signal generator 12 generates at least two RF test signals (at different frequencies). By generating (and measuring) multiple test signals in parallel, for each step of the frequency sweep, fewer measuring steps are required and the measuring time required to cover a determined frequency bandwidth at a certain frequency resolution can be reduced.

Preferably, during the entire frequency sweep, the frequency of the first test signal is always lower than the frequency of the second test signal which is generated simultaneously to the first test signal. For example, at the start of the frequency sweep the frequency of the first test signal (f1) is 20 MHz and the frequency of the second test signal (f2) is 25 MHz, and at the end of the frequency sweep f1=995 MHz and f2=1,000 MHz. An increase of f1 and f2 during the sweep can be done synchronously by a few Hz or a few kHz each step. This is especially useful when the signals are subsequently fed to an ADC, because both frequencies are close together and can be processed together by the same ADC.

For instance, the distance between both frequencies should be smaller than a bandwidth of the ADC. In an example, the distance between both frequencies f1 and f2 is smaller than 50%, 40%, 30%, 25%, 20%, 15% or 10% of the bandwidth of the ADC. Furthermore, the distance between both frequencies can be bigger than 1%, 3%, 5% or 10% of the bandwidth of the ADC.

For example, the frequencies of the first and the second test signal can always be changed at the same time during the frequency sweep. Both signals and, thus, both frequencies could be generated by different RF sources which are synchronous to each other.

Furthermore, during the frequency sweep, the frequencies of the first test signal can be predominately lower than the frequency of the second test signal. For instance, f1 is swept from 0 to 500 MHz while f2 is swept from 500 to 1000 MHz.

For instance, during the frequency sweep, the two test signals are increased by the same frequency starting from their respective initial frequencies.

Furthermore, at an initial time t=0 of the frequency sweep, the frequency of the first test signal can be lower than the frequency of the second test signal, and at time t=1 (the next frequency step) the frequency of the first test signal can be higher than the frequency of the second test signal at t=0 (e.g., f1(t=0)<f2 (t=0); f1(t=1)>f2 (t=0); and f1(t=1)<f2 (t=1)). Thus, the frequencies of the first and the second test signal can be increased in a staggered manner, for instance:

| t = 0: | f1 = 100 MHz; | f2 = 101 MHz |
| t = 1: | f2 = 102 MHz; | f2 = 103 MHz. |

In another example, the frequencies of both test signals are swept in a blockwise manner. For instance, f1 is swept from 0 MHz to 25 MHz and f2 is swept from 25 MHz to 50 MHz, or f1 is swept from 50 MHz to 75 MHz and f2 is swept from 75 MHz to 100 MHz. One frequency block can comprise a certain frequency bandwidth in which only one test signal is present at a time. In other words, each frequency block of a test signal is free of the other test signal.

The exemplary device 10 shown in FIG. 1 comprises a further port 14' and a further signal path 13' which connects the further port 14' to the RF signal generator 12. In the following, the signal path 13 and the port 14 are referred to as first signal path 13 and first port 14, and the further signal path 13' and further port 14' are referred to as second signal path 13' and second port 14', respectively. However, this does not imply that the device 10 may only comprises two signal paths or two ports. In fact, the device 10 may comprise at least two further signal path connected to at least two further ports, each signal path being coupled to the measurement unit and the RF signal generator in a similar fashion as the signal paths 13 and 13'.

As shown in FIG. 1, the DUT 11 can be connected to the first port 14 and to the second port 14'.

The second signal path 13' can be configured to receive the at least two test signals from the RF signal generator 12 and to feed said test signals to the second port 14' for forwarding to the DUT 11 and/or to receive at least two further response signals of the DUT from the second port 14'.

In particular, the second signal path 13' (and the second port 14') can receive the at least two further response signals in response to the test signals being forwarded to the DUT via the first port 14 or via the second port 14'. In case the test signals are forwarded via the first port 14, the response signal received at the second port 14' can be "transmitted" signals (i.e., generated by the transmission of the test signals through the DUT 11), and in case the test signals are forwarded to the DUT 11 via second port 14', the response signal received at the second port 14' can be "reflected" signals (i.e., generated by the reflection of the test signals from the DUT 11).

Likewise, the first signal path 13 (and the first port 14) can receive the at least two response signals in response to the test signals being forwarded to the DUT via the first port 14 or via the second port 14'.

The device can comprise a further (or second) forward coupler 16' being connected to the second signal path 13' and adapted to forward at least a part of each of the at least two test signals to the measurement unit 15 and/or a further (or second) reverse coupler 17' being connected to the further signal path and adapted to forward at least a part of each the at least two further response signals to the measurement unit 15.

In other words, the measurement device 10 can simultaneously forward at least two test signals via the first port 14 or the second port 14' to the DUT and simultaneously receive at least two response signals to the test signals at the first port 14 and/or at the second port 14'. In each case, the measurement device 10 can forward respective parts of the at least two test signals and the at least two response signals to the measurement unit 15 which can simultaneously measure these forwarded signal parts in amplitude and phase.

The measurement device 10 can be operated in a first operating state or mode and in a second operating state or mode.

In the first operating state (or mode), the measurement device 10 can be configured to generate and transmit the at least two test signals through the first signal path 13 towards the first port 14; wherein the measurement device 10 is configured to: a) forward the parts of each of the at least two test signals via the first forward coupler 16 to the measurement unit 15; b) forward the parts of each of the at least two response signals from the first port 14 via the first reverse coupler 17 to the measurement unit 15; and c) forward the parts of each of the at least two further response signals from the second port 14' via the second reverse coupler 17' to the measurement unit 15.

In the second operating state (or mode), the measurement device 10 can be configured to generate and transmit the at least two test signals through the second signal path 13' towards the second port 14'; wherein the measurement device 10 is configured to: a) forward the parts of each of the at least two test signals via the second forward coupler 16' to the measurement unit 15; b) forward the parts of each of the at least two response signals from the first port 14 via the first reverse coupler 17 to the measurement unit 15; and c) forward the parts of each of the at least two further response signals from the second port 14' via the second reverse coupler 17' to the measurement unit 15.

In both the first and second operating state, the measurement unit 15 can be adapted to simultaneously measure the forwarded parts of the at least two test signals, the at least two response signals and/or the at least two further response signals, each in amplitude and phase.

The measurement unit 15 can be configured to calculate S-parameters of the DUT 11 over a predefined or determined frequency bandwidth. This calculation can be at least partially based on the amplitude and phase measurements of the parts of the at least two test signals, the at least to response signals and/or the at least two further response signals.

Figure 2:
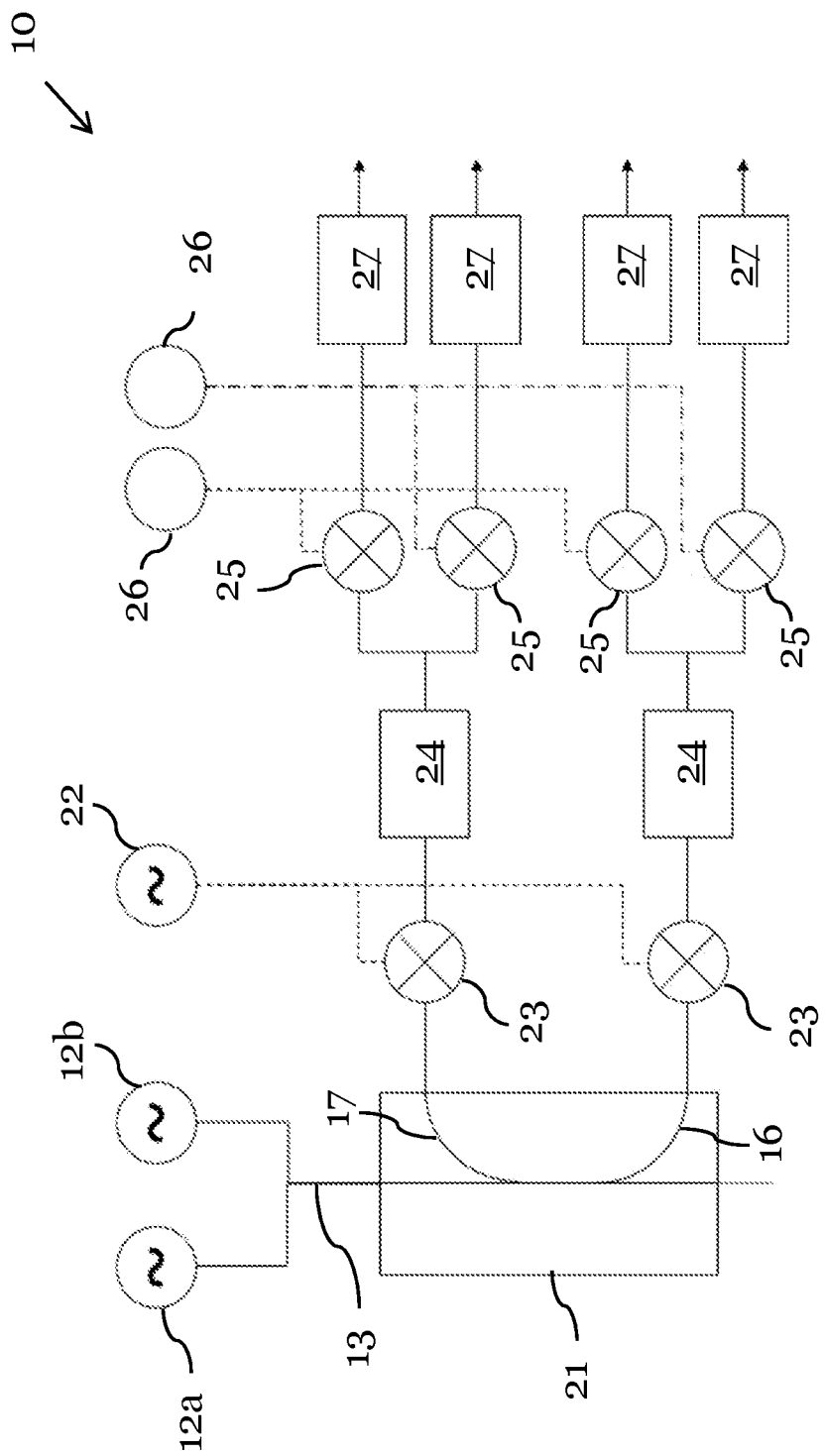
FIG. 2 shows a schematic diagram of a measurement device for characterizing a DUT according to an embodiment.

FIG. 2 shows a schematic diagram of the measurement device 10 according to an embodiment. In particular, FIG. 2 shows elements of the measurement device 10 which are coupled between a signal path 13 and the measurement unit 15.

The signal path 13 in FIG. 2 is connected to two RF sources 12a, 12b of the RF signal generator 12. For instance, each of the RF source 12a, 12b can be configured to generate one of two test signals. A direction coupler 21 is connected to the signal path. The directional coupler 21 can comprise the forward coupler 16 and the reverse coupler 17.

The forward coupler 16 and the reverse coupler 17 can each be connected to a mixing unit which is configured to down-convert the forwarded parts of the two test signals respectively the forwarded parts of the two response signals into IF signals.

In the example shown in FIG. 2, each of the mixing units comprises a single mixer 23, wherein the mixers 23 are connected to a common source 22 (e.g., a local oscillator). The mixers 23 can be frequency mixers for RF signals. For instance, the mixer 23 coupled to the forward coupler 16 receives and down-converts the decoupled parts of the two test signals and the mixer 23 coupled to the reverse coupler 17 receives and down-converts the decoupled parts of the two response signals.

Each of the mixers 23 can forward the generated IF signals to a respective ADC 24. The ADCs 24 can be configured to digitalize the IF signals forwarded by the mixers 23. Each of the ADCs 24 can be a broadband ADC capable of digitalizing both down-converted test signals respectively both down-converted response signals in parallel.

Each of the ADCs 24 can be further connected to two digital mixers 25. For instance, each of the digital mixers 25 is configured to receive one of the digitalized test signals respectively one of the digitalized response signals, e.g. to further down convert said signals. In each case, two of the mixers 25 can each be coupled to a common numerically controlled oscillator 26. Each digital mixer 25 can feed its output signal to a respective digital filter 27. After being filtered by the filters 27, the signals can be forwarded to the measurement unit 15 (not shown in FIG. 2).

Figure 3:
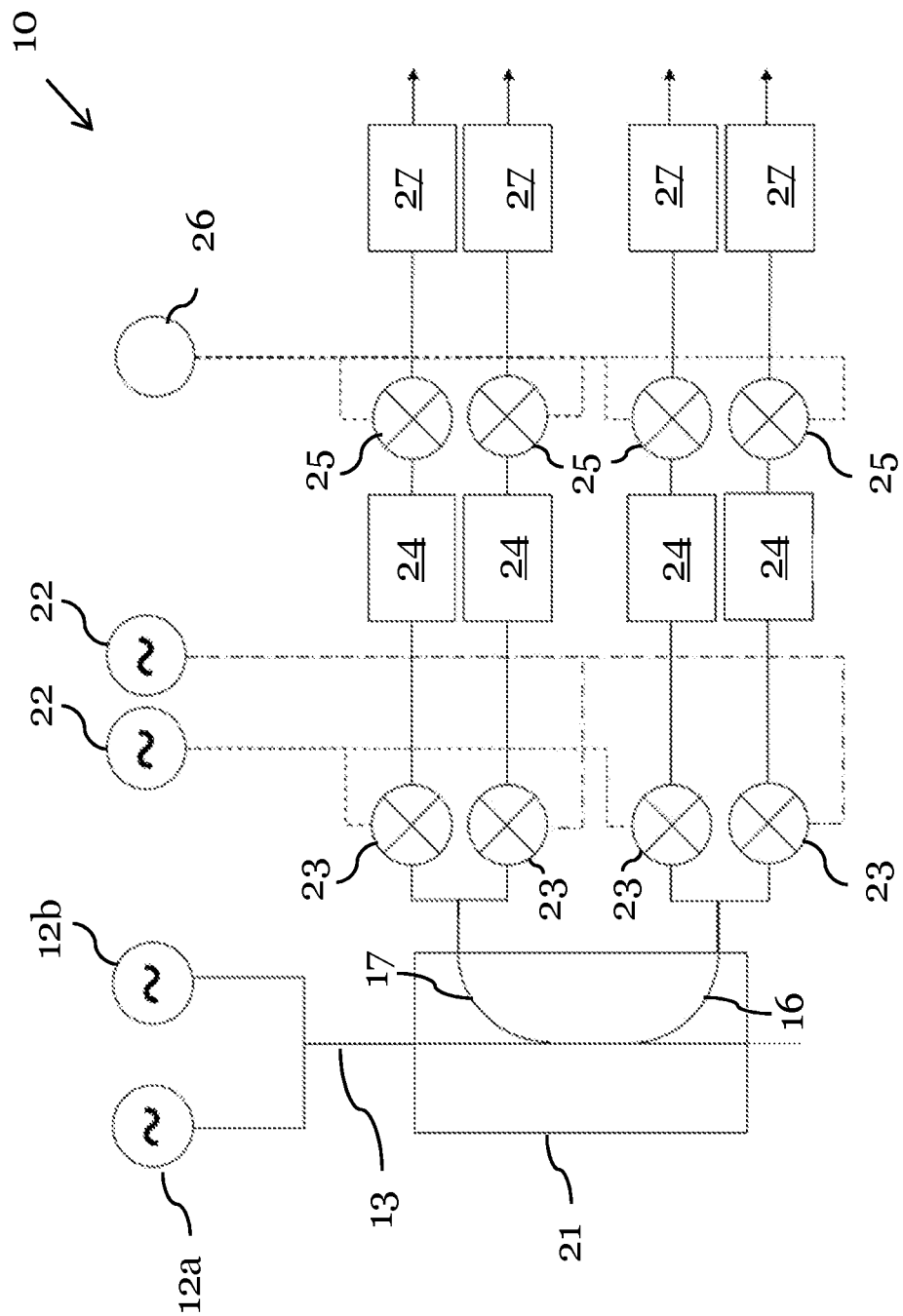
FIG. 3 shows a schematic diagram of a measurement device for characterizing a DUT according to an embodiment.

FIG. 3 shows a further example for the elements of the measurement device 10 which are coupled between the signal path 13 and the measurement unit 15.

In the example shown in FIG. 3, the mixing unit coupled to the forward coupler 16 and the mixing unit coupled to the reverser coupler 17 each comprise two mixers 23. For instance, each mixer 23 receives and down-converts a part of one of the two test signals or of one of the two response signals, respectively.

The mixers 23 can be coupled to two respective sources 22 (e.g., local oscillators). For instance, a first source 22 is coupled to the mixers 23 which down-convert the parts of the first test signal and the first response signal (that is based on the first test signal), and a second source 22 is coupled to the mixers 23 which down-converts the parts of the second test signal and the second response signal (that is based on second test signal).

Each of the mixers 23 in FIG. 3 can be coupled to a respective ADC 24 for digitalizing the down-converted IF signals. Each ADC 24 can further forward the digitalized signal to a digital mixer 25 coupled to a numerically controlled oscillator 26. Each digital mixer 25 can feed its output signal to a respective digital filter 27. After being filtered by the filters 27, the signals can be forwarded to the measurement unit 15 (not shown in FIG. 2).

In case a frequency sweep is performed, the local oscillator(s) 22 of the respective mixers 23 can be adapted according to the actual frequency of the at least two test signals.

For instance, the minimal frequency offset between the two (or more) test signals can depend on the filter 27. In particular, the frequency offset can be chosen such that the signals can be separated by the filter stage which can be formed by the filters 27 in FIG. 2 or 3.

For instance, each signal path 13, 13' of the measurement device 10 that connects the RF signal generator 12 to a port can be coupled to the measurement unit 15 as shown in FIG. 2 or FIG. 3.

Figure 4B:
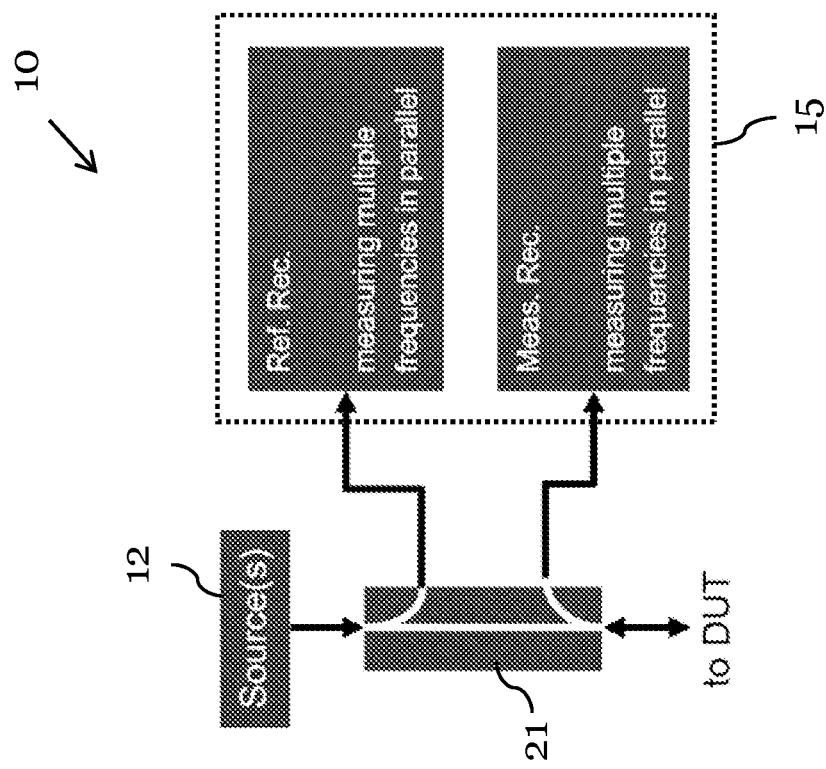
FIGS. 4A-4B show schematic diagrams of a measurement device for characterizing a DUT according to an embodiment.
Figure 4A:
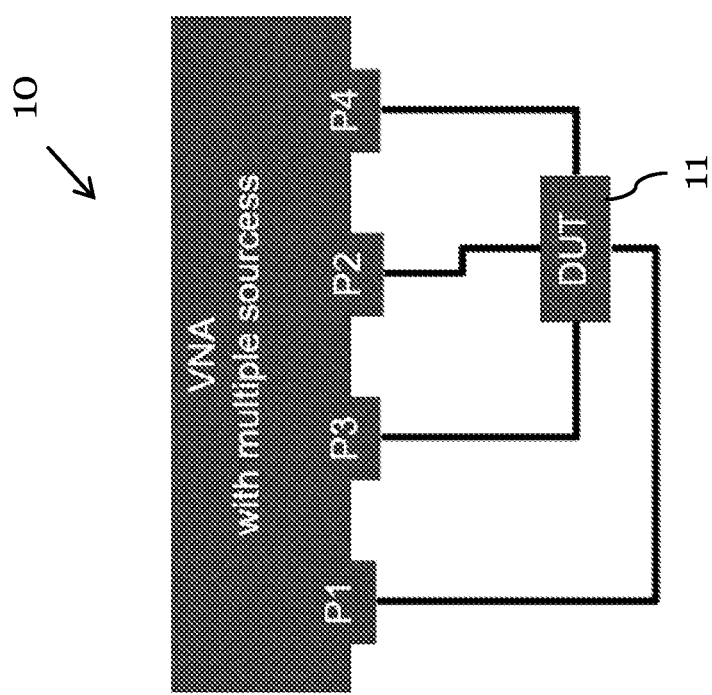

FIGS. 4A-4B show schematic diagrams of the measurement device 10 according to an embodiment.

Thereby, FIG. 4A shows that the measurement device 10 can comprise four ports P1-P4, wherein the DUT 11 can be connected to each of the four ports. FIG. 4B shows that each of the ports P1-P4 can be connected to the RF signal generator 12 via a respective signal path, wherein a directional coupler 21 (which comprises the forward coupler 16 and the reverse coupler 17) can forward parts of at least two test signals and at least two response signals traveling on the signal path to the measurement unit 15.

With the setup shown in FIGS. 4A and 4B, 4-port characterization measurements of the DUT 11 can be carried out with multiple (at least two) test signals in parallel. In this way, the measurement times of the 4-port measurements can be strongly reduced (at least by a factor of two).

Figure 5:
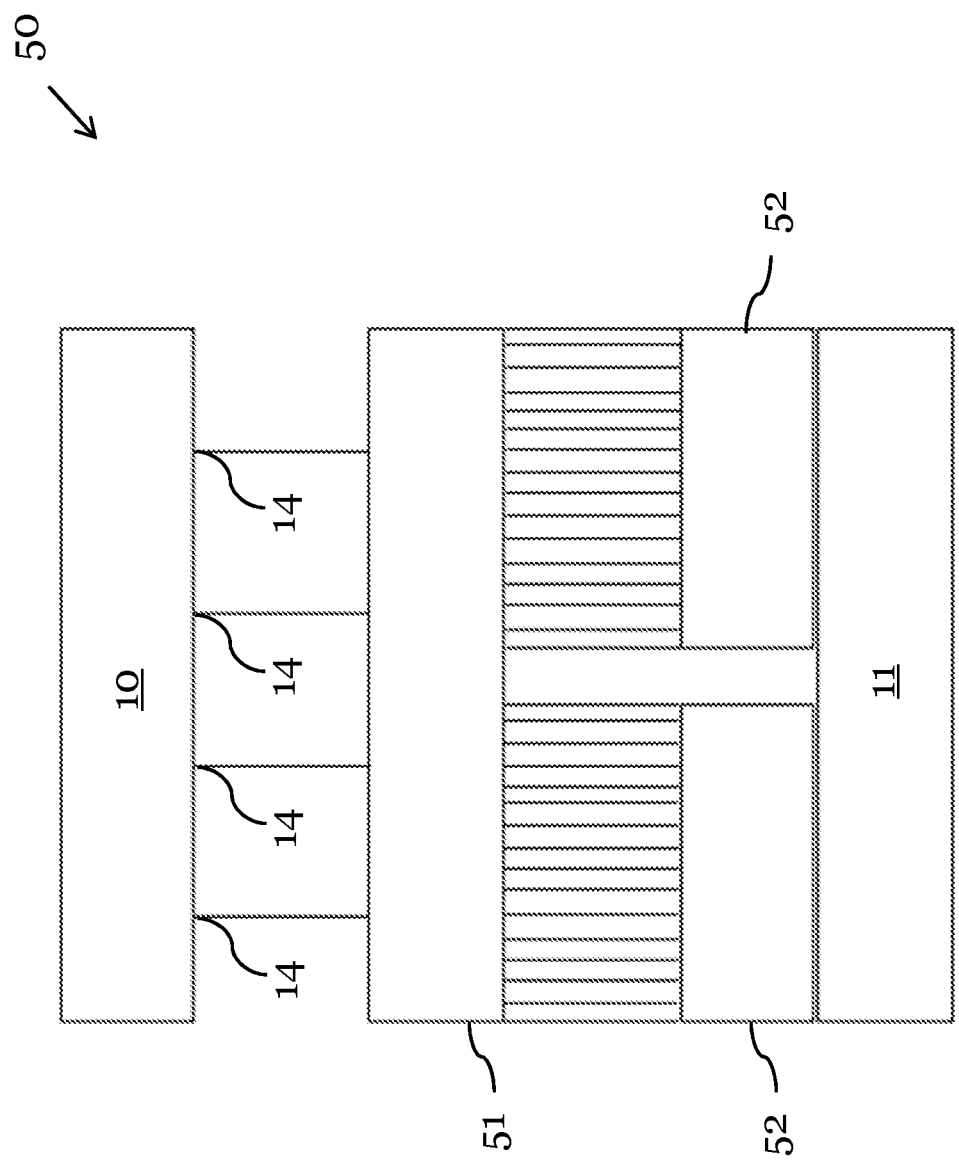
FIG. 5 shows a schematic diagram of a system comprising a measurement device according to an embodiment.

FIG. 5 shows a schematic diagram of a system 50 comprising a measurement device 10 according to an embodiment. The system 50 further comprises a switch matrix 51 which is connected between at least one port 14 of the measurement device and the DUT 11. Thereby, the measurement device 10 can be configured to control this switch matrix 51. For instance, the measurement device 10 can be connected to the switch matrix 51 via a suitable communication interface, e.g. USB or LAN. The switch matrix 51 can comprise semiconductor switches or mechanical switches, the switching operation of which can controlled by the measurement device 10.

For instance, the switch matrix 51 can be connected to four ports 14 of the measurement device 10 and can provide a large number of connecting ports, e.g. 32 ports, for connecting the DUT 11. The DUT 11 can be a cable, such as an Ethernet cable which comprises 8 twisted conductor pairs, i.e., in total 16 wires which are to be measured. For characterization, both ends of the cable can be connected to the switch matrix 51 and, thus, the measurement device 10. The switch matrix 51 can then successively connect both ends of the twisted conductor pairs to the ports of the measurement device 10 to perform 4-port measurements.

By using such a switching matrix 51, individual screw-on steps can be eliminated, so that the measurements for the different lines in the cable can be performed directly one after the other which leads to an additional reduction in measurement time. Furthermore, the parallel measurements at two (or more) frequencies further reduces the measurement time. In this way, the throughput of cable tests can be significantly enhanced.

For example, the system 50 can further comprise a connection board 52 which is switched between the switch matrix 51 and the DUT 11. The connection board 52 can provide the correct connector or adapter for connecting the DUT 11. The connection board 52 can form a cable fixture or a measurement adapter.

FIG. 6 shows a flow diagram of a method 60 of operating a system 50 comprising a measurement device 10 and a switch matrix 51 according to an embodiment. The method 60 is thereby used to analyze a DUT, such as a cable, which comprises a plurality of conductor lines. The method 60 can be carried out with the system 50 as shown in FIG. 5.

The method 60 comprises the steps of: connecting 61 both ends of the plurality of conductor lines to respective test ports of the switch matrix 51; forwarding 62 the at least two test signals to one end of one of the plurality of conductor lines; and measuring 63 the at least two response signals at the other end of the conductor line which receives the test signal, and at both ends of one, more or all further conductor lines of the plurality of conductor lines which are connected to the switch matrix 51.

Thereby, the switch matrix 51 can forward the test signals from the measurement device 10 to the respective ends of the conductor lines, and can forward the response signals from the respective ends of the conductor lines to the measurement device 10 for the measurements.

The DUT can be a cable, in particular a cable comprising twisted wires or conductor lines (twisted pairs). For example, each two of the conductor lines of the cable are twisted together.

By measuring both the transmission at the end of the conductor line which receives the test signals and at one or more other conductor lines of the cable, the attenuation of the first line and the crosstalk to the other conductor line(s) can be measured.

For example, the test signals are forwarded to one end of a first conductor line and the response signals are measured at the other end of the first conductor line and at both ends of a second conductor line, wherein the first and the second conductor line are twisted together. In this way, a 4-port measurement can be carried out with a twisted pair cable.

In a further step, the crosstalk to further (third, fourth etc.) conductor lines can be measured, by measuring the at least two response signals at both ends of the further conductor lines. For instance, when forwarding the test signals to one conductor line (e.g., line 1) the response signals can be measured sequentially or simultaneously at the other conductor lines, for instance: line 1→line 2; line 1→line 3; line 1→line 4; line 2→line 3; . . . .

After forwarding the test signals to one end of a conductor line and measuring the response at the other end (and at further lines), the test signals can subsequently be forwarded to the other end of the conductor line and the measurement can be repeated.

The measurements with multiple lines can be carried out in parallel. For instance, the test signals can be forwarded to one end of line 1 and the response can be measured at both ends of line 2. In parallel thereto, the test signals can be forwarded to one end of line 5 and the response can be measured at both ends of line 6. Per line, at least two test signals which have a different frequency can be used.

For instance, the test signals forwarded to one line (e.g., line 1) can be different to the test signals forwarded to another line (e.g., line 5). In this way, unwanted crosstalk can be avoided, as a signal from line 5 can couple to line 2 but will not be measured because it is outside of the downcoverted intermediate frequency IF.

All features described above or features shown in the figures can be combined with each other in any advantageous manner within the scope of the disclosure.

The invention claimed is:

1. A measurement device for characterizing a device-under-test, DUT, comprising:
   an RF signal generator configured to generate at least two test signals in parallel, wherein the at least two test signals each have a different frequency;
   a signal path connecting the RF signal generator to a port of the measurement device, wherein the port is arranged for being connected to the DUT;
   the signal path being configured to feed the at least two test signals to the port and to receive at least two response signals of the DUT from the port;
   a measurement unit;
   a forward coupler being connected to the signal path and adapted to forward at least a part of each of the at least two test signals to the measurement unit; and
   a reverse coupler being connected to the signal path and adapted to forward at least a part of each of the at least two response signals to the measurement unit;
   the measurement unit being adapted to simultaneously measure the forwarded parts of the at least two test signals and the at least two response signals, each in amplitude and phase.

2. The measurement device of claim 1,
   wherein the RF signal generator is configured to amend the frequencies of the at least two test signals by predefined and/or adjustable frequency steps over a determined frequency bandwidth.

3. The measurement device of claim 2,
   wherein the at least two test signals are each increased by the same frequency, starting from their respective initial frequencies.

4. The measurement device of claim 1, further comprising:
   a first mixing unit which is configured to down-convert the forwarded parts of the at least two test signals into intermediate frequency, IF, signals;
   a first analog-to-digital converter, ADC, unit which is configured to digitize the down-converted parts of the test signals;
   a second mixing unit which is configured to down-convert the forwarded parts of the at least two response signals into IF signals; and
   a second ADC unit which is configured to digitize the down-converted parts of the response signals.

5. The measurement device of claim 4,
   wherein the first mixing unit comprises only one mixer which is configured to down-convert the forwarded parts of the at least two test signals; and
   wherein the first ADC unit comprises only one ADC which is configured to digitize the down-converted parts of the test signals.

6. The measurement device of claim 4,
   wherein the second mixing unit comprises only one mixer which is configured to down-convert the forwarded parts of the at least two response signals;
   wherein the second ADC unit comprises only one ADC which is configured to digitize the down-converted parts of the response signals.

7. The measurement device of claim 4,
wherein the first mixing unit comprises at least two mixers, wherein a first mixer of the at least two mixers is configured to down-convert the forwarded part of a first one of the at least two test signals and wherein a second mixer of the at least two mixers is configured to down-convert the forwarded part of a second one of the at least two test signals; and
wherein the first ADC unit comprises at least two ADCs, wherein a first ADC of the at least two ADCs is configured to digitize the down-converted part of the first one of the test signals and wherein a second ADC of the at least two ADCs is configured to digitize the down-converted part of the second one of the test signals.

8. The measurement device of claim 4,
wherein the second mixing unit comprises at least two mixers, wherein a first mixer of the at least two mixers is configured to down-convert the forwarded part of a first one of the at least two response signals and wherein a second mixer of the at least two mixers is configured to down-convert the forwarded part of a second one of the at least two response signals; and
wherein the second ADC unit comprises at least two ADCs, wherein a first ADC of the at least two ADCs is configured to digitize the down-converted part of the first one of the response signals and wherein a second ADC of the at least two ADCs is configured to digitize the down-converted part of the second one of the response signals.

9. The measurement device of claim 1, further comprising:
a further signal path connecting the RF signal generator to a further port of the measurement device, wherein the further port is arranged for being connected to the DUT;
wherein the further signal path is configured to feed the at least two test signals to the further port and/or to receive at least two further response signals of the DUT from the further port.

10. The measurement device of claim 9, further comprising:
a further forward coupler being connected to the further signal path and adapted to forward at least a part of each of the at least two test signals to the measurement unit;
and/or a further reverse coupler being connected to the further signal path and adapted to forward at least a part of each the at least two further response signals to the measurement unit.

11. The measurement device of claim 10,
wherein, in a first operating state, the measurement device is configured to transmit the at least two test signals through the first signal path to the first port;
wherein the measurement device is configured to: a) forward parts of each of the at least two test signals via the forward coupler to the measurement unit; b) forward parts of each of the at least two response signals from the first port via the reverse coupler to the measurement unit; and
c) forward parts of each of the at least two further response signals from the further port via the further reverse coupler to the measurement unit.

12. The measurement device of claim 10, wherein, in a second operating state, the measurement device is configured to transmit the at least two test signals through the further signal path to the further port;
wherein the measurement device is configured to: a) forward parts of each of the at least two test signals via the further forward coupler to the measurement unit; b) forward parts of each of the at least two response signals from the port via the reverse coupler to the measurement unit; and c) forward parts of each of the at least two further response signals from the further port via the further reverse coupler to the measurement unit.

13. The measurement device of claim 1,
wherein the measurement unit is configured to calculate S-parameters of the DUT over a determined frequency bandwidth at least based on the measurements of the forwarded parts of the at least two test signals and the at least two response signals.

14. The measurement device of claim 1,
wherein the measurement device comprises at least four ports, wherein each of the at least four ports is arranged for being connected to the DUT, and wherein each of the at least four ports is connected to the RF signal generator by a respective signal path;
wherein the measurement device is adapted to apply the at least two test signals to each of the at least four ports in an alternating manner; and
wherein each signal path is connected to the measurement unit by a respective forward coupler and a respective reverse coupler.

15. A method of operating a system to analyze a device-under-test, DUT,
the DUT comprises a plurality of conductor lines,
the system comprises a measurement device and a switch matrix which is connected between at least one port of the measurement device and the DUT, wherein the measurement device is configured to control the switch matrix, and the measurement device comprises:
an RF signal generator configured to generate at least two test signals in parallel, wherein the at least two test signals each have a different frequency;
a signal path connecting the RF signal generator to a port of the measurement device, wherein the port is arranged for being connected to the DUT;
the signal path being configured to feed the at least two test signals to the port and to receive at least two response signals of the DUT from the port;
a measurement unit;
a forward coupler being connected to the signal path and adapted to forward at least a part of each of the at least two test signals to the measurement unit; and
a reverse coupler being connected to the signal path and adapted to forward at least a part of each of the at least two response signals to the measurement unit;
the measurement unit being adapted to simultaneously measure the forwarded parts of the at least two test signals and the at least two response signals, each in amplitude and phase,
the method comprising the steps of:
connecting both ends of the plurality of conductor lines to respective test ports of the switch matrix;
forwarding the at least two test signals to one end of one of the plurality of conductor lines; and
measuring the at least two response signals:
at the other end of the conductor line which receives the at least two test signals, and
at both ends of one, more or all further conductor lines of the plurality of conductor lines.

16. The method of claim 15,
wherein the switch matrix comprise a plurality of test ports adapted to be connected to one or more than one DUT;
wherein the switch matrix is configured to subsequently connect each of the plurality of the test ports to the at least one port of the measurement device.

* * * * *